(12) United States Patent
Chew et al.

(10) Patent No.: US 8,304,842 B2
(45) Date of Patent: Nov. 6, 2012

(54) INTERCONNECTION STRUCTURE FOR N/P METAL GATES

(75) Inventors: Han-Guan Chew, Singapore (SG); Ming Zhu, Singapore (SG); Lee-Wee Teo, Singapore (SG); Harry-Hak-Lay Chuang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 110 days.

(21) Appl. No.: 12/836,106

(22) Filed: Jul. 14, 2010

(65) Prior Publication Data

US 2012/0012937 A1 Jan. 19, 2012

(51) Int. Cl.
*H01L 27/088* (2006.01)
*H01L 29/78* (2006.01)

(52) U.S. Cl. ............ 257/401; 257/412; 257/E29.027; 257/29.028

(58) Field of Classification Search ............ 257/401, 257/412, E29.027, E29.028
See application file for complete search history.

(56) References Cited

U.S. PATENT DOCUMENTS

| | | | |
|---|---|---|---|
| 5,935,751 A | 8/1999 | Matsuoka et al. | |
| 2007/0111419 A1* | 5/2007 | Doyle et al. | 438/197 |
| 2007/0272975 A1* | 11/2007 | Schaeffer et al. | 257/327 |
| 2009/0146215 A1* | 6/2009 | Ogawa | 257/369 |
| 2010/0048013 A1* | 2/2010 | Thei et al. | 438/591 |
| 2010/0187612 A1* | 7/2010 | Ikeno et al. | 257/369 |
| 2010/0314687 A1* | 12/2010 | Xu | 257/369 |
| 2011/0062526 A1* | 3/2011 | Xu et al. | 257/369 |
| 2011/0095376 A1* | 4/2011 | Hooker et al. | 257/369 |
| 2011/0275212 A1* | 11/2011 | Chen et al. | 438/592 |
| 2012/0001259 A1* | 1/2012 | Chuang et al. | 257/331 |
| 2012/0012941 A1* | 1/2012 | Niimi et al. | 257/369 |

FOREIGN PATENT DOCUMENTS

| | | |
|---|---|---|
| JP | 09-146307 | 6/1997 |
| JP | 10-207116 | 8/1998 |
| JP | 10-239902 | 9/1998 |
| JP | 2006-259010 | 9/2006 |
| JP | 2009-064008 | 3/2009 |

* cited by examiner

*Primary Examiner* — Ngan Ngo
(74) *Attorney, Agent, or Firm* — Lowe Hauptman Ham & Berner, LLP

(57) ABSTRACT

The disclosure relates to integrated circuit fabrication, and more particularly to an interconnection structure for N/P metal gates. An exemplary structure for an interconnection structure comprises a first gate electrode having a first portion of a first work-function metal layer under a first portion of a signal metal layer; and a second gate electrode having a second portion of the first work-function metal layer interposed between a second work-function metal layer and a second portion of the signal metal layer, wherein the second portion of the signal metal layer is over the second portion of the first work-function metal layer, wherein the second portion of the signal metal layer and the first portion of the signal metal layer are continuous, and wherein a maximum thickness of the second portion of the signal metal layer is less than a maximum thickness of the first portion of the signal metal layer.

20 Claims, 15 Drawing Sheets

US 8,304,842 B2

INTERCONNECTION STRUCTURE FOR N/P METAL GATES

FIELD OF THE INVENTION

The invention relates to integrated circuit fabrication, and more particularly to an interconnection structure.

BACKGROUND

Semiconductor devices are used in a large number of electronic devices, such as computers, cell phones, and others. Semiconductor devices comprise integrated circuits (ICs) that are formed on semiconductor wafers by depositing many types of thin films of material over the semiconductor wafers, and patterning the thin films of material to form the ICs. The ICs include field-effect transistors (FETs), such as metal-oxide-semiconductor field-effect transistors (MOSFETs).

As technology nodes shrink, in some IC designs, there has been a desire to replace the typically poly-silicon gate electrode with a metal gate electrode to improve device performance with the decreased feature sizes. One process of forming the metal gate electrode is termed a "gate last" process in which the final metal gate electrode is fabricated "last" which allows for reduced number of subsequent processes, including high temperature processing, that must be performed after formation of the gate.

FIG. 1 shows a top view of a semiconductor device 100 comprising a conventional interconnection structure 110 fabricated by a "gate last" process. The semiconductor device 100 comprises an n-type MOSFET (nMOSFET) 100n and a p-type MOSFET (pMOSFET) 100p. The nMOSFET 100n is formed from the first gate electrode 110n overlying the channel region of the active area 104n. The pMOSFET 100p is formed from the second gate electrode 110p overlying the channel region of the active area 104p. The first gate electrode 110n and second gate electrode 110p are electrically coupled to each other and collectively hereinafter referred to as an interconnection structure 110. The interconnection structure 110 is electrically coupled to a voltage source via a contact 130.

FIGS. 2A-C show cross-section views taken along the respective lines of FIG. 1. FIG. 2A illustrates a cross-sectional view of the second gate electrode 110p of the pMOSFET 100p taken along the line a-a of FIG. 1. The second gate electrode 110p may comprise a first barrier metal layer 112p, a p-type work function metal layer 114p, a second barrier metal layer 116p, and a signal metal layer 118p. FIG. 2B illustrates a cross-sectional view of the first gate electrode 110n of the nMOSFET 100n taken along the line b-b of FIG. 1. The first gate electrode 110n may comprise a first barrier metal layer 112n, an n-type work function metal layer 114n, a second barrier metal layer 116n, and a signal metal layer 118n. FIG. 2C illustrates a cross-sectional view of an interconnection structure 110 comprising both the first gate electrode 110n of the nMOSFET 100n and the second gate electrode 110p of the pMOSFET 100p taken along the line c-c of FIG. 1. A contact 130 is deposited on the interface between the first gate electrode 110n and the second gate electrode 110p.

However, there are challenges to implement such features and processes in complementary metal-oxide-semiconductor (CMOS) fabrication. As the gate length and spacing between devices decrease, these problems are exacerbated. For example, it is difficult to achieve a uniform contact resistance for all CMOS devices 100n/100p because shifts in the position of the contact 130 to the interconnection structure 110 causes shifts in the contact resistance to the CMOS devices 100n/100p. The unstable contact resistance may provide unstable voltage supply through the contact 130 to the interconnection structure 110, thereby increasing the likelihood of device instability and/or device failure.

Accordingly, what is needed is an interconnection structure in which the contact resistance is less sensitive to process variation.

BRIEF DESCRIPTION OF THE DRAWINGS

The present disclosure is best understood from the following detailed description when read with the accompanying figures. It is emphasized that various features are not drawn to scale and are used for illustration purposes only. In fact, the dimensions of the various features in the drawings may be arbitrarily increased or reduced for clarity of discussion.

FIGS. 5A-9A, 5B-9B, and 5C-9C show cross-section views taken along the respective lines of FIG. 4 at various stages of fabrication according to various aspects of the present disclosure.

DETAILED DESCRIPTION

Figure 1:
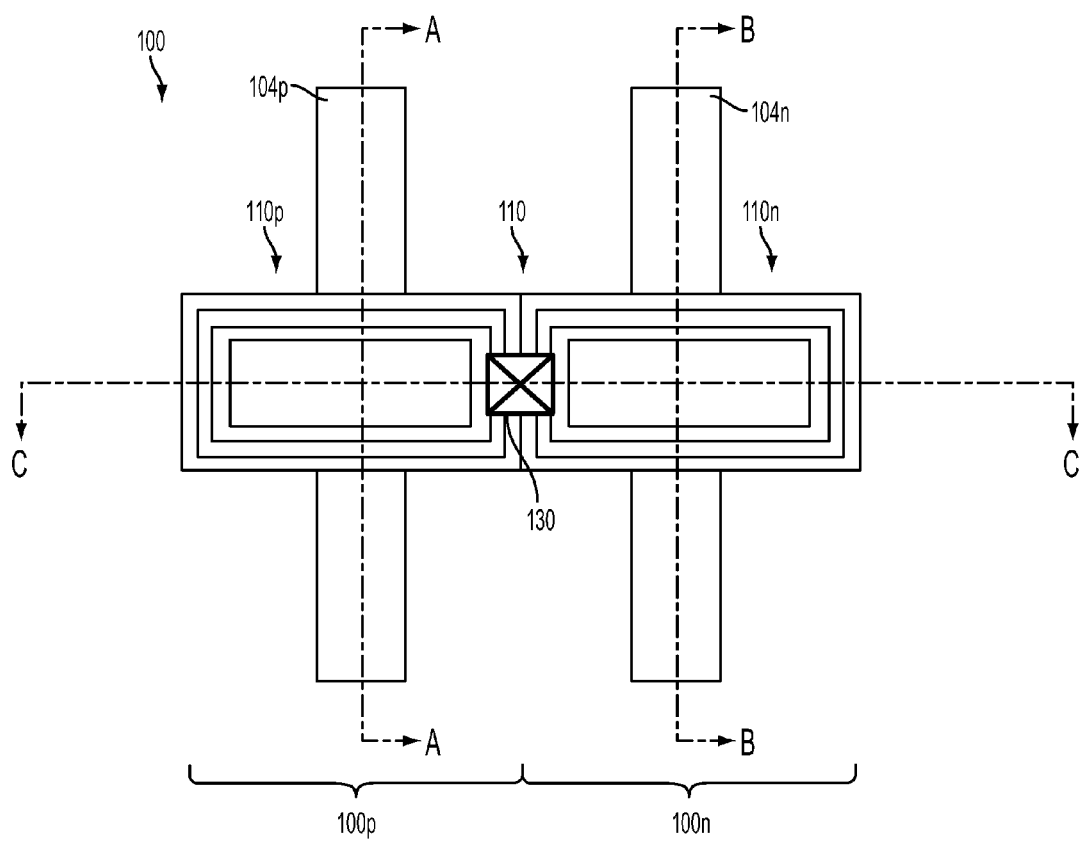
FIG. 1 shows a top view of a conventional interconnection structure.
Figure 2A:
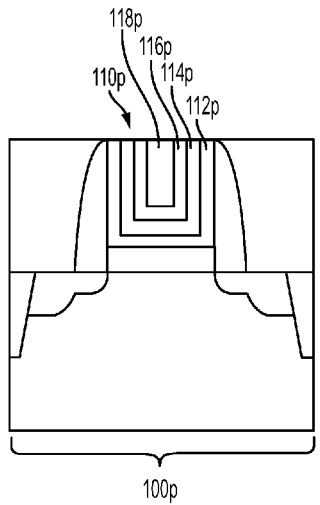
FIGS. 2A-2C show cross-section views taken along the respective lines of FIG. 1.
Figure 2B:
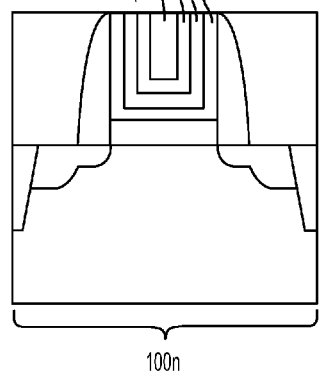
Figure 2C:
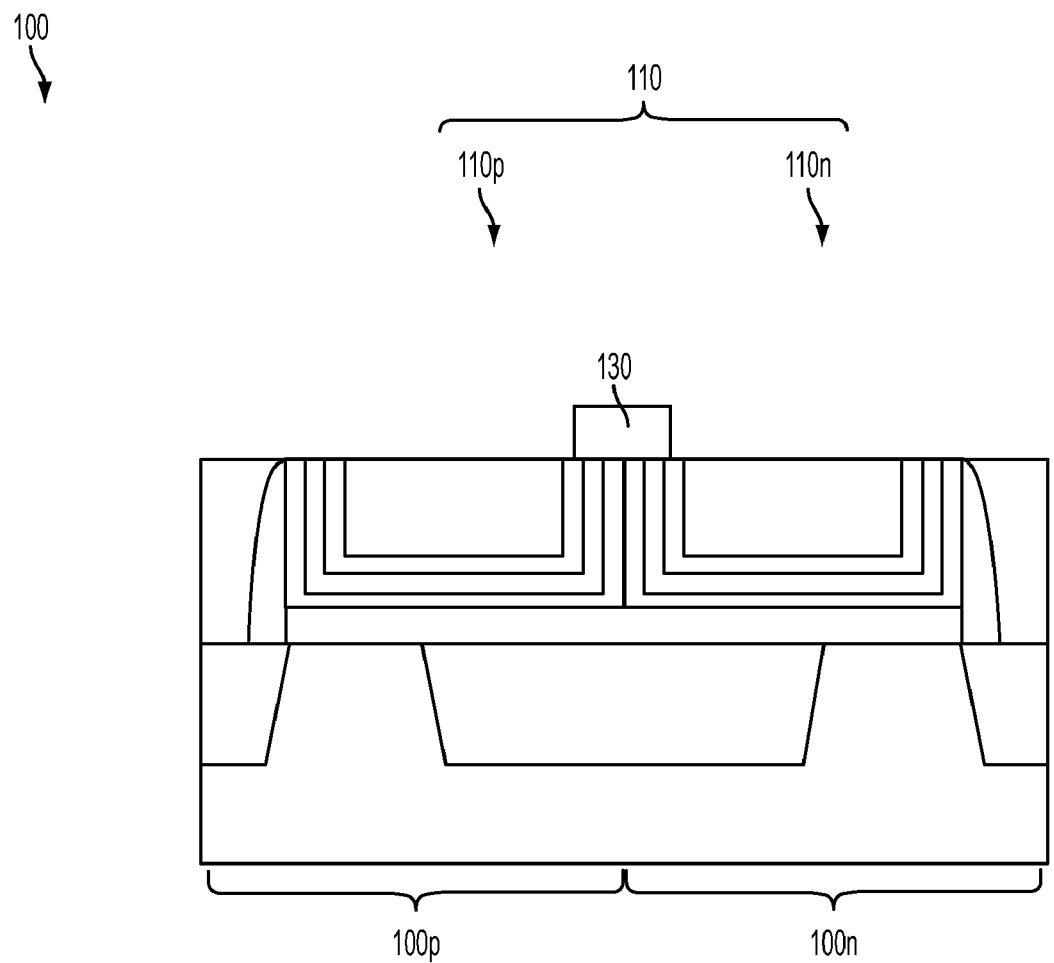

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 3:
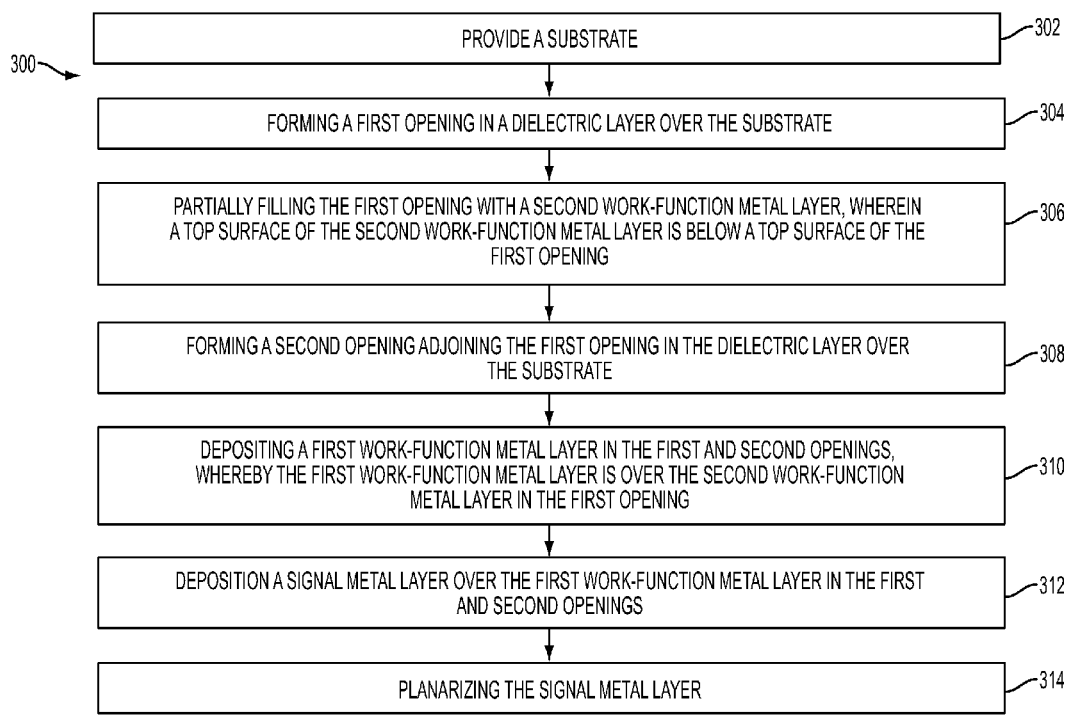
FIG. 3 is a flowchart illustrating a method for fabricating an interconnection structure according to various aspects of the present disclosure.
Figure 4:
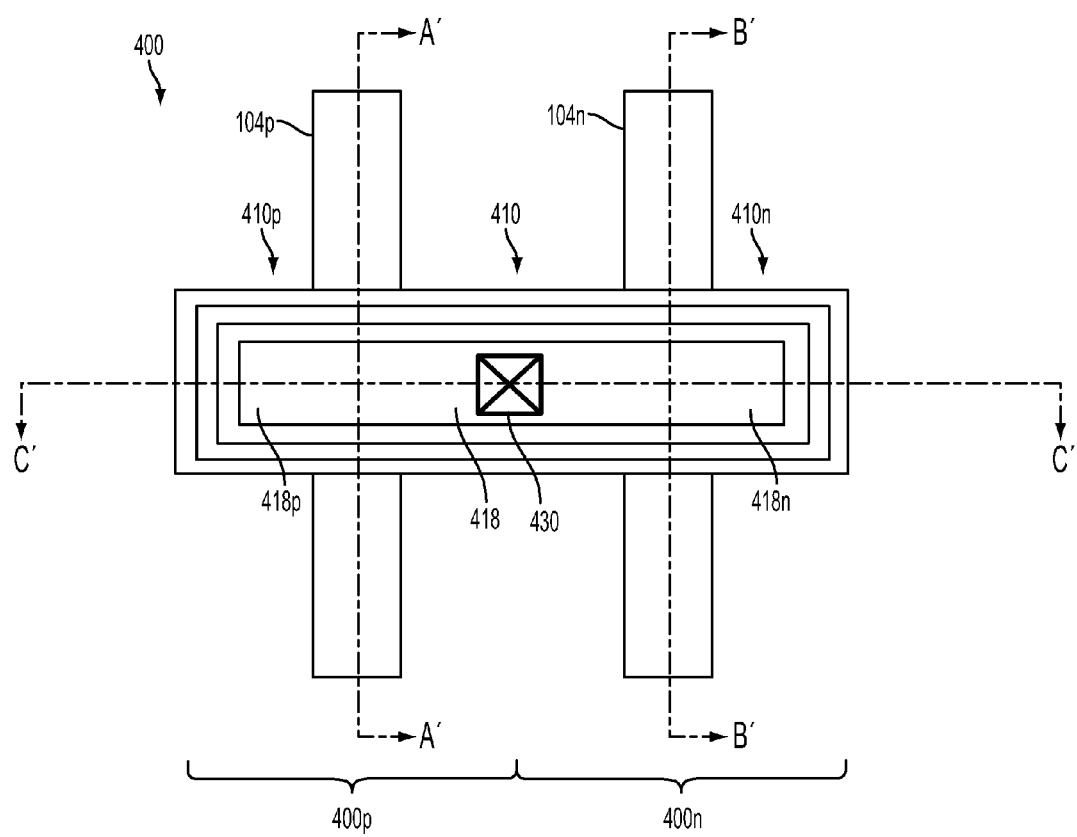
FIG. 4 shows a top view of an interconnection structure according to various aspects of the present disclosure.

FIG. 3 is a flowchart illustrating a method 300 for fabricating an interconnection structure 410 (shown in FIGS. 4 and 9C) according to various aspects of the present disclosure. FIG. 4 shows a top view of a semiconductor device 400 comprising an interconnection structure 410 according to various aspects of the present disclosure; and FIGS. 5A-9A, 5B-9B, and 5C-9C show cross-section views taken along the respective lines of FIG. 4 at various stages of fabrication according to various aspects of the present disclosure. It is noted that part of the semiconductor device 400 may be fabricated with CMOS technology processing. Accordingly, it is understood that additional processes may be provided before, during, and after the method 300 of FIG. 3, and that some other processes may only be briefly described herein. Also, FIGS. 3 through 9C are simplified for a better understanding of the inventive concepts of the present disclosure. For example, although the figures illustrate an interconnection structure 410 for the semiconductor device 400, it is understood the semiconductor device 400 may be part of an integrated circuit (IC) that may comprise a number of other devices comprising resistors, capacitors, inductors, fuses, etc.

FIG. 4 shows a top view of a semiconductor device 400 comprising an interconnection structure 410. The semiconductor device 400 comprises an nMOSFET 400n and a pMOSFET 400p. The nMOSFET 400n is formed from a first gate electrode 410n overlying the channel region of the active area 104n. The pMOSFET 400p is formed from a second gate electrode 410p overlying a channel region of the active area 104p. The first gate electrode 410n comprising a first portion 418n of a signal metal layer 418 and second gate electrode 410p comprising a second portion 418p of the signal metal layer 418 are electrically coupled to each other and collectively hereinafter referred to as an interconnection structure 410. The signal metal layer 418 is electrically coupled to a voltage source via a contact 430. It should be noted that both the first portion 418n and the second portion 418p of the signal metal layer 418 comprise the same low-resistance conductive material. Thus the second portion 418p of the signal metal layer 418 and the first portion 418n of the signal metal layer 418 are a single metal layer. Therefore, a shift in the position of the contact 430 to the signal metal layer 418 will not change the contact resistance to either the nMOSFET 400n or pMOSFET 400p since both MOSFETs share the same signal metal layer 418. Accordingly, Applicant's method of fabricating a semiconductor device 400 may fabricate a fixed-contact-resistance interconnection structure 410 to provide a stable voltage supply to the interconnection structure 410, thereby enhancing the device performance.

Further, FIGS. 5A-9A, 5B-9B, and 5C-9C show cross-section views taken along the respective lines of FIG. 4 at various stages of fabrication according to various aspects of the present disclosure. FIGS. 5A-9A show schematic cross-sectional views of a pMOSFET 400p taken along the line a'-a' of FIG. 4 at various stages of fabrication according to various aspects of the present disclosure; FIGS. 5B-9B show schematic cross-sectional views of an nMOSFET 400n taken along the line b'-b' of FIG. 4 at various stages of fabrication according to various aspects of the present disclosure; FIGS. 5C-9C show schematic cross-sectional views of an interconnection structure 410 taken along the line c'-c' of FIG. 4 at various stages of fabrication according to various aspects of the present disclosure.

Referring to FIGS. 3, 5A, 5B, and 5C, the method 300 begins at step 302 wherein a substrate 102 is provided. The substrate 102 may comprise a silicon substrate. The substrate 102 may alternatively comprise silicon germanium, gallium arsenic, or other suitable semiconductor materials. The substrate 102 may further comprise other features such as various doped regions, a buried layer, and/or an epitaxial layer. Furthermore, the substrate 102 may be a semiconductor on insulator such as silicon on insulator (SOI). In other embodiments, the semiconductor substrate 102 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

The semiconductor substrate 302 may comprise a first active region 104p for the pMOSFET 400p, a second active region 104n for the nMOSFET 400n and isolation regions 106. The active regions 104p, 104n may include various doping configurations depending on design requirements. For example, the first active region 104p is doped with n-type dopants, such as phosphorus or arsenic; the second active region 104n is doped with p-type dopants, such as boron or $BF_2$.

Isolation regions 106 may be formed on the substrate 102 to isolate the various active regions 104p, 104n from each other. The isolation regions 106 may utilize isolation technology, such as local oxidation of silicon (LOCOS) or shallow trench isolation (STI), to define and electrically isolate the various active regions 104p, 104n. In the present embodiment, the isolation region 106 comprises a STI. The isolation regions 106 may comprise materials such as silicon oxide, silicon nitride, silicon oxynitride, fluoride-doped silicate glass (FSG), a low-k dielectric material, and/or combinations thereof. The isolation regions 106, and in the present embodiment, the STI, may be formed by any suitable process. As one example, the formation of the STI may include patterning the semiconductor substrate 102 by a conventional photolithography process, etching a trench in the substrate 102 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Figure 5A:
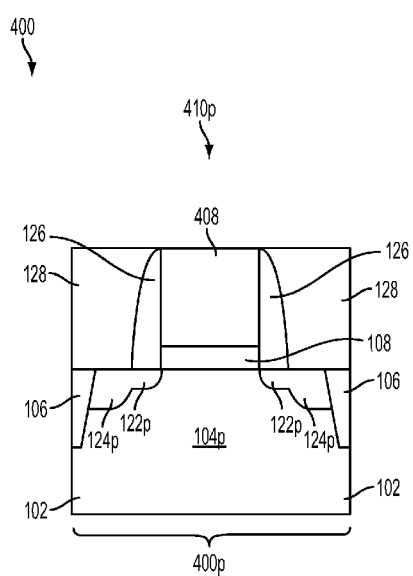
Figure 5B:
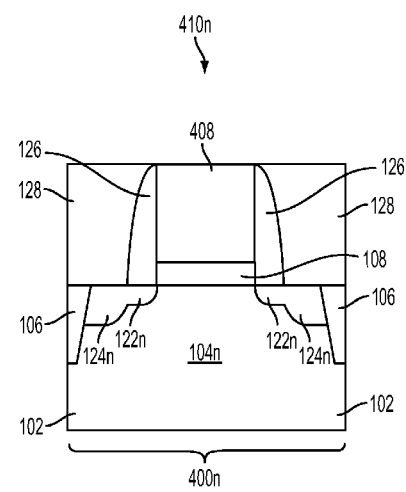
Figure 5C:
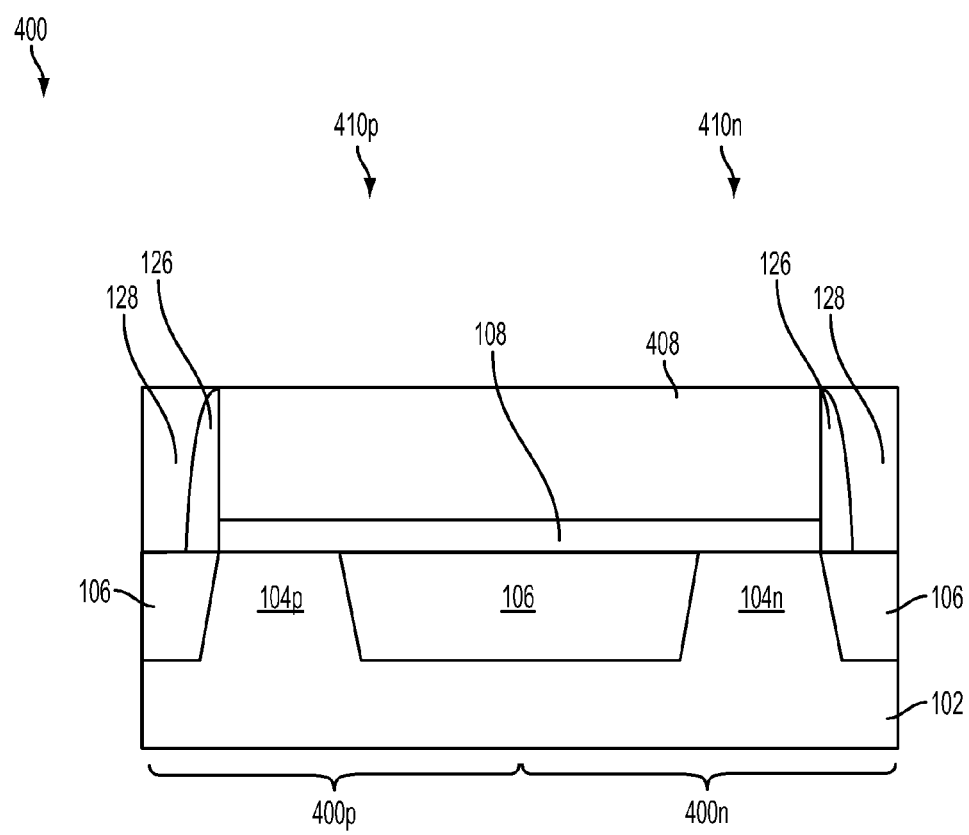
Figure 6A:
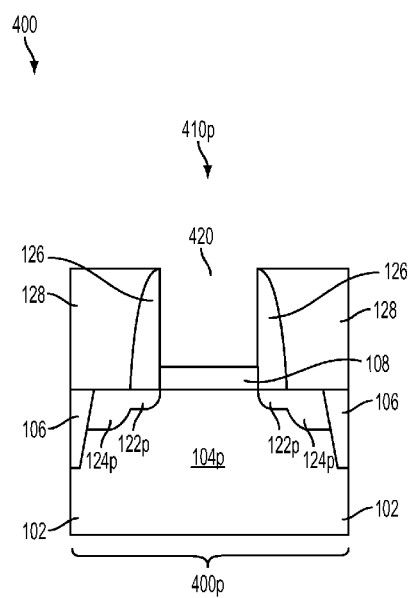
Figure 6B:
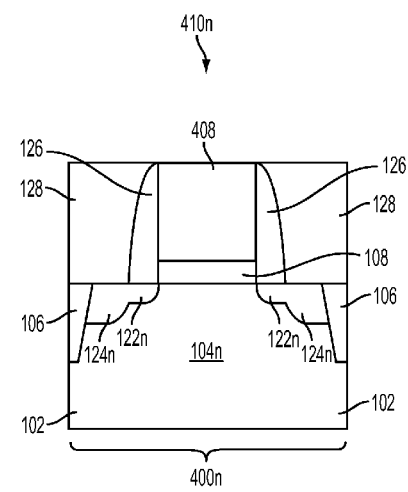
Figure 6C:
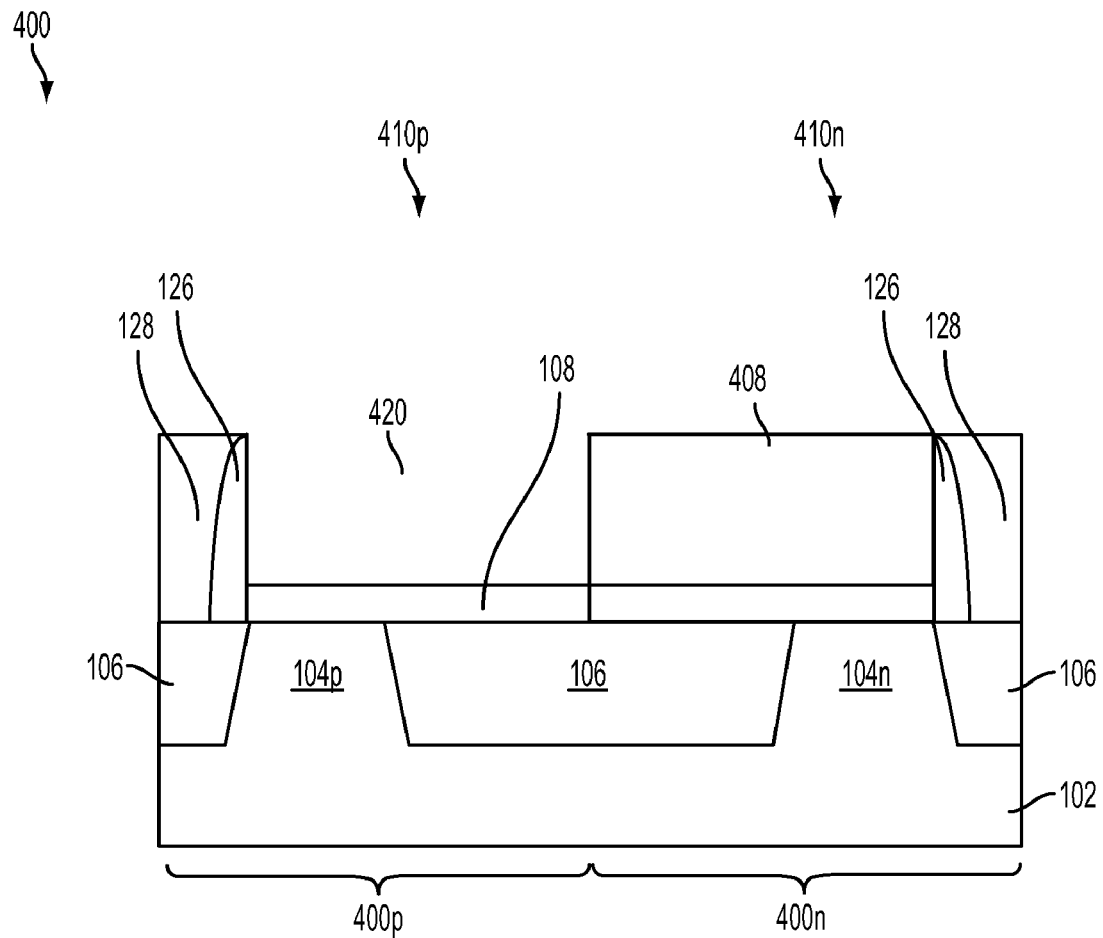
Figure 7A:
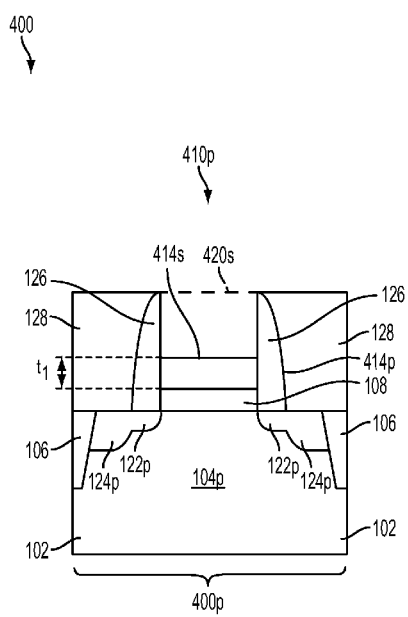
Figure 7B:
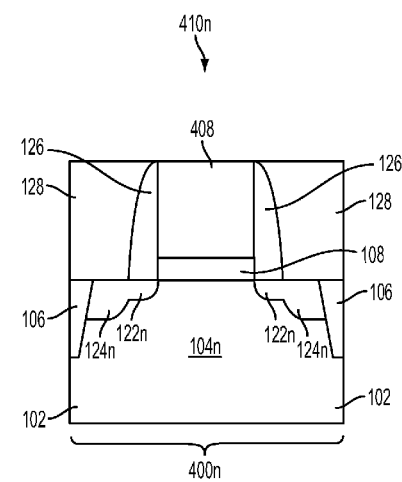
Figure 7C:
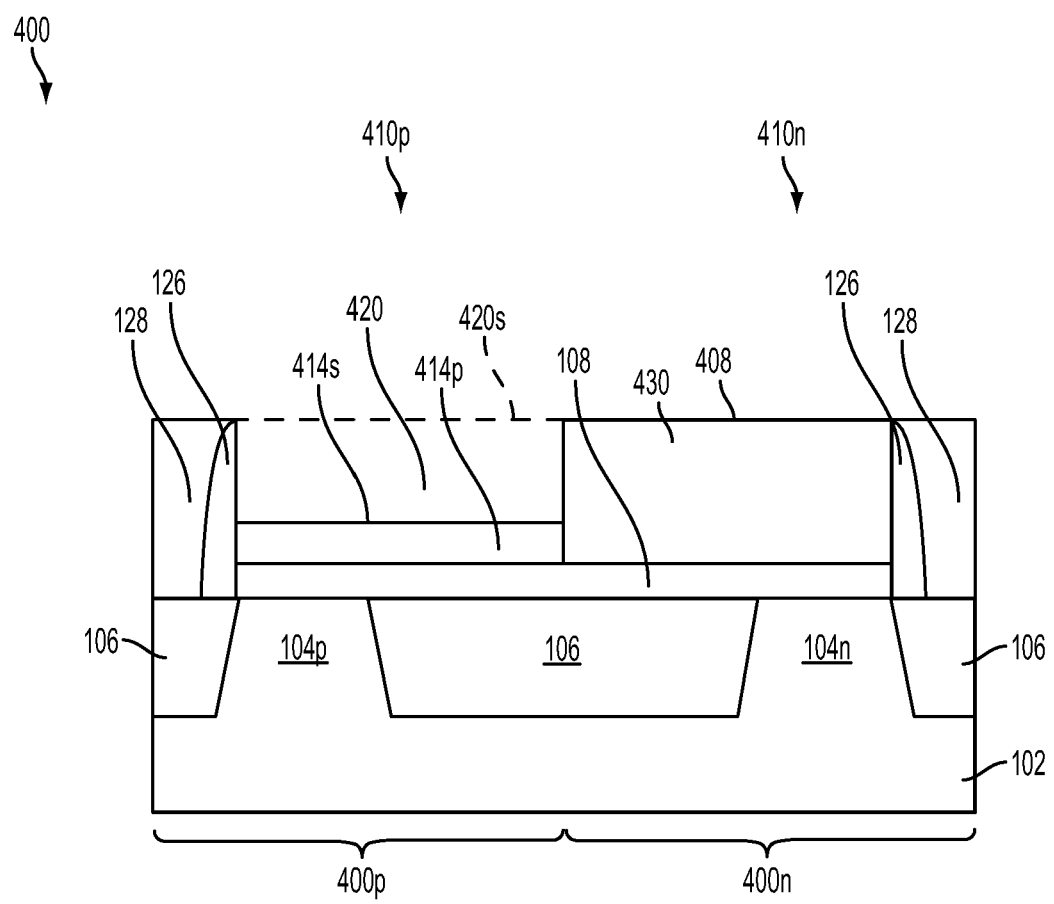
Figure 8A:
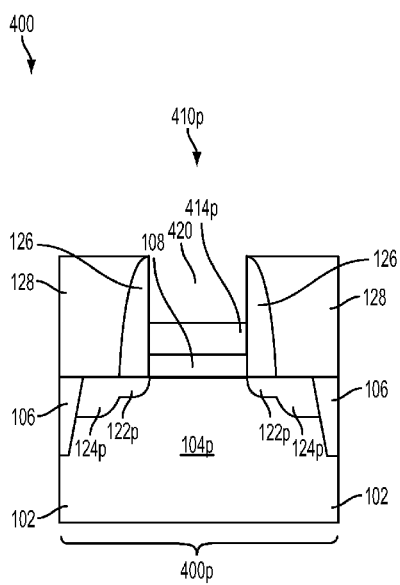
Figure 8B:
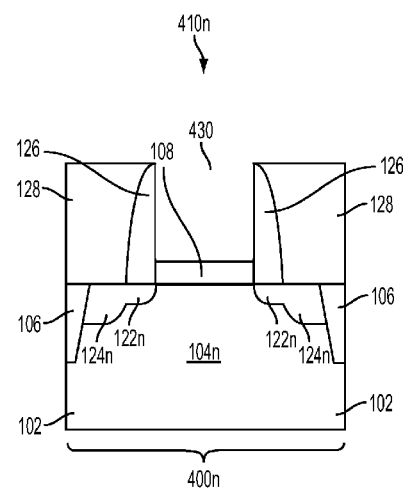
Figure 8C:
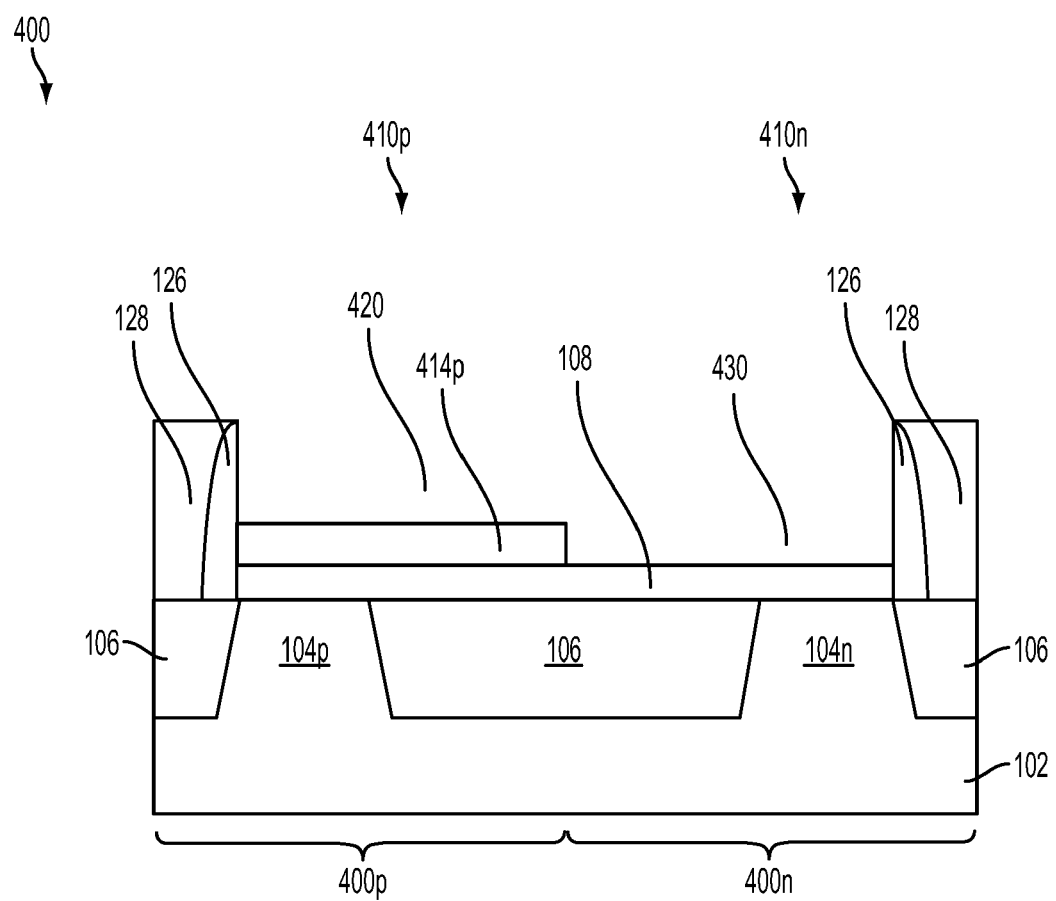
Figure 9A:
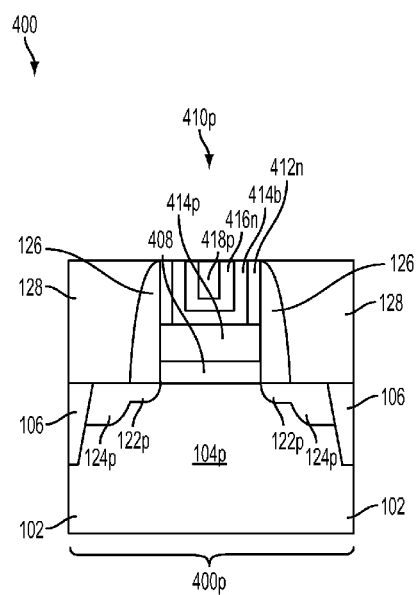
Figure 9B:
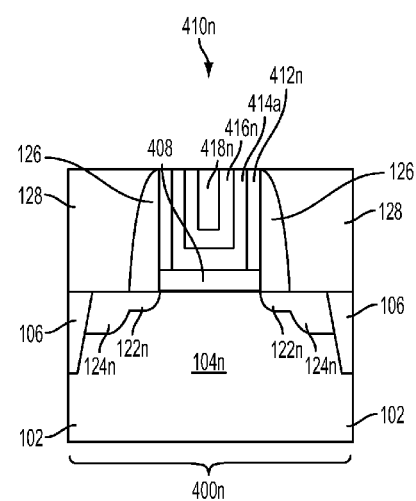
Figure 9C:
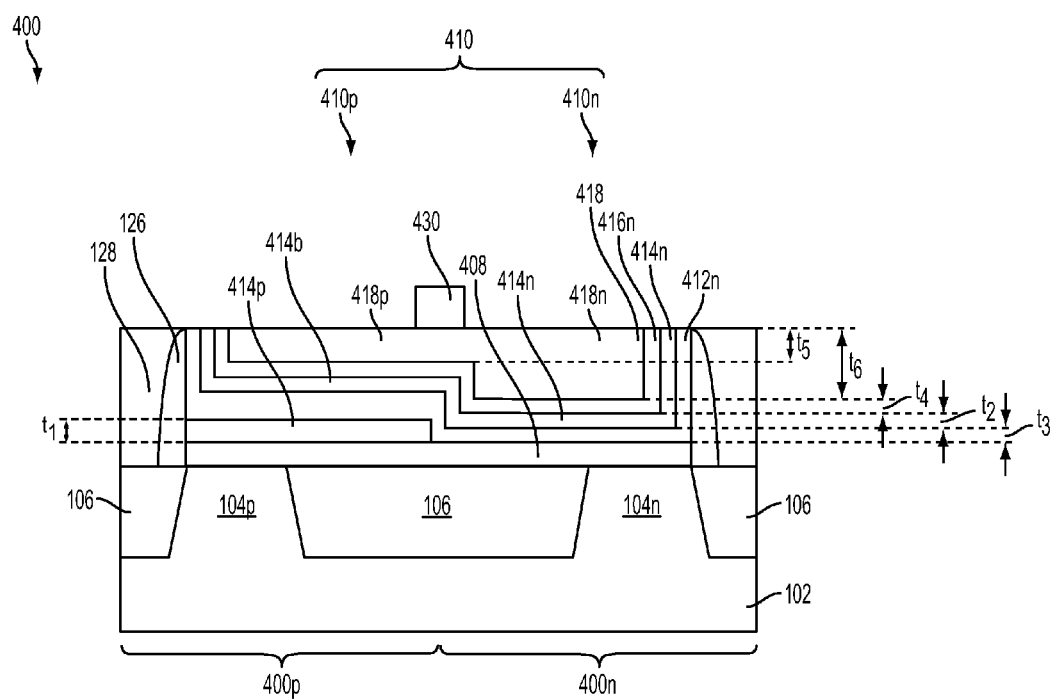

Still referring to FIGS. 5A, 5B, and 5C, a gate dielectric layer 108 may be formed over the substrate 102. In some embodiments, the gate dielectric layer 108 may comprise silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 108 is a high-k dielectric layer comprising $HfO_x$ with a thickness in the range of about 10 to 30 angstroms. The gate dielectric layer 108 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 108 may further comprise an interfacial layer (not shown) to reduce damage between the gate dielectric layer 108 and the substrate 102. The interfacial layer may comprise silicon oxide.

In a gate last process, a dummy gate electrode layer 408 is subsequently formed over the gate dielectric layer 108. In some embodiments, the dummy gate electrode layer 408 may comprise a single layer or multilayer structure. In the present embodiment, the dummy gate electrode layer 408 may comprise poly-silicon. Further, the dummy gate electrode layer 408 may be doped poly-silicon with the uniform or gradient doping. The dummy gate electrode layer 408 may have a thickness in the range of about 30 nm to about 60 nm. The dummy electrode layer 408 may be formed using a low-pressure chemical vapor deposition (LPCVD) process. In one embodiment, the LPCVD process can be carried out in a LPCVD furnace at a temperature of about 580° C. to 650° C. and at a pressure of about 200 mTorr to 1 Torr, using silane ($SiH_4$) or dichlorosilane ($SiH_2Cl_2$) as the silicon source gas.

Then, a layer of photoresist is formed over the dummy gate electrode layer 408 by a suitable process, such as spin-on coating, and patterned to form a patterned photoresist feature (i.e., cover one of the gates so other gate can be separately processed) the gate dielectric layer 108 and the dummy gate electrode layer 408) by a proper lithography patterning method. A width of the patterned photoresist feature is in the range of about 15 to 45 nm. The patterned photoresist feature can then be transferred using a dry etching process to the underlying layers (i.e., the gate dielectric layer 108 and the dummy gate electrode layer 408) to form gate structures 410p, 410n. The photoresist layer may be stripped thereafter.

In another example, a hard mask layer (not shown) is formed over the dummy gate electrode layer 408; a patterned photoresist layer is formed on the hard mask layer; the pattern of the photoresist layer is transferred to the hard mask layer and then transferred to the dummy gate electrode layer 408 and the gate dielectric layer 108 to form the gate structures 410p, 410n. The hard mask layer comprises silicon oxide. Alternatively, the hard mask layer may optionally comprise silicon nitride, and/or silicon oxynitride, and may be formed using a method such as CVD or PVD. The hard mask layer comprises a thickness in the range from about 100 to 800 angstroms.

It is noted that the semiconductor device 400 may undergo other "gate last" processes and other CMOS technology processing to form various features of the semiconductor device 400. As such, the various features are only briefly discussed herein. The various components of the semiconductor device 400 may be formed prior to formation of the gate electrodes 410p, 410n in a "gate last" process. The various components may comprise lightly doped source/drain regions (p-type and n-type LDD) 122p, 122n and source/drain regions (p-type and n-type S/D) 124p, 124n in the active regions 104p, 104n and on opposite sides of the gate electrodes 410p, 410n. The p-type LDD 122p and S/D 124p regions may be doped with B or In, and the n-type LDD 122n and S/D 124n regions may be doped with P or As. The various features may further comprise gate spacers 126 and an interlayer dielectric (ILD) layer 128 on opposite sidewalls of the gate electrodes 410p, 410n. The gate spacers 126 may be formed of silicon oxide, silicon nitride or other suitable materials. The ILD 128 may include an oxide formed by a high-aspect-ratio process (HARP) and/or a high-density-plasma (HDP) deposition process.

Referring to FIGS. 3, 6A, 6B, and 6C, the method 300 continues with step 304 in which a first opening 420 in a dielectric layer (i.e., between the gate spacers 126) may be formed over the substrate 102. In the present embodiment, using the gate spacers 126 as hard masks, a first portion of the dummy gate electrode layer 408 may be removed from the gate electrode 410p to form the first opening 420 in the gate spacers 126, while a second portion of the dummy gate electrode layer 408 in the gate structure 410n are covered by a patterned photoresist layer. The first portion of the dummy gate electrode layer 408 may be removed using a dry etch process. In one embodiment, the dry etch process for the first portion of the dummy poly-silicon gate electrode layer 408 may be performed under a source power of about 650 to 800 W, a bias power of about 100 to 120 W, and a pressure of about 60 to 200 mTorr, using $Cl_2$, HBr and He as etching gases.

Referring to FIGS. 3, 7A, 7B, and 7C, the method 300 continues with step 306 in which a second work-function metal layer 414p partially fills the first opening 420, so that a top surface 414s of the second work-function metal layer 414p is below a top surface 420s of the first opening 420. The second work-function metal layer 414p comprises a material selected from a group of TiN, WN, TaN and Ru. The second work-function metal layer 414p may be formed by CVD, PVD or other suitable technique. In the present embodiment, the second work-function metal layer 414p may be first deposited over the gate dielectric layer 108, gate spacers 126, and ILD 128 to fill the first opening 420. Then, a chemical mechanical polishing (CMP) may be performed to remove the second work-function metal layer 414p outside of the first opening 420. Finally, a top portion of the second work-function metal layer 414p in the first opening 420 may be removed by a wet etching to form a portion of a second gate electrode 410p of the pMOSFET 400p. The wet etching process may have a high selectivity such that the wet etching process may stop at the gate spacers 126. For example, the wet etching chemistry may include HCl and $H_2O_2$ to selectively remove the top portion of the second work-function metal layer 414p, so that a top surface 414s of the second work-function metal layer 414p is below a top surface 420s of the first opening 420. The remaining second work-function metal layer 414p has a maximum thickness $t_1$ ranging from 150 to 350 angstroms.

Referring to FIGS. 3, 8A, 8B, and 8C, the method 300 continues with step 308 in which a second opening 430 adjoining the first opening 420 in the dielectric layer (i.e., the gate spacers 126) is formed over the substrate 102. In one embodiment, using the gate spacers 126 and remaining second work-function metal layer 414p as hard masks, the second portion of the dummy gate electrode layer 408 is removed from the gate electrode 410n to form a second opening 430 in the gate spacers 126. The second portion of the dummy gate electrode layer 408 may be removed using a wet etch and/or a dry etch process. In one embodiment, the wet etch process for dummy poly-silicon gate electrode layer 408 includes exposure to a hydroxide solution containing ammonium hydroxide, diluted HF, deionized water, and/or other suitable etchant solutions. In other embodiments, the dry etch process for dummy poly-silicon gate electrode layer 408 may be performed under a source power of about 650 to 800 W, a bias power of about 100 to 120 W, and a pressure of about 60 to 200 mTorr, using $Cl_2$, HBr and He as etching gases.

Referring to FIGS. 3, 9A, 9B, and 9C, the method 300 continues with step 310 in which a first work-function metal layer 414n is deposited in the first and second openings 420, 430, whereby the first work-function metal layer 414n is over the second work-function metal layer 414p in the first opening 420. The first work-function metal layer 414n comprises a material selected from a group of Ti, Ag, Al, TiAl, TiAlN, TaC, TaCN, TaSiN, Mn, and Zr. The first work-function metal layer 414n has a maximum thickness $t_2$ ranging from 30 to 80 angstroms. Therefore, the maximum thickness $t_1$ of the second work-function metal layer is greater than the maximum thickness $t_2$ of the first work-function metal layer. The first work-function metal layer 414n may be formed by CVD, PVD or other suitable technique. The first work-function metal layer 414n in the first opening 420 is referred to as a second portion 414b of the first work-function metal layer 414n, and the first work-function metal layer 414n in the second openings 430 is referred to as a first portion 414a of the first work-function metal layer 414n. Thus the second portion 414b of the first work-function metal layer 414n and the first portion 414a of the first work-function metal layer 414n are continuous. Further, the second portion 414b of the first work-function metal layer 414n is over the second work-function metal layer 414p in the first opening 420.

In some embodiments, an optional first bather layer 412n may be deposited before the first work-function metal layer 414n deposition to reduce diffusion of the signal metal layer 418 into the gate dielectric 108. In the first opening 420 the first barrier layer 412n is between the second portion 414b of the first work-function metal layer 414n and the second work-function metal layer 414p, and in the second opening 430 the first barrier layer 412n is between the first portion 414a of the first work-function metal layer 414n and the gate dielectric layer 108. The first barrier layer 412n comprises a material selected from a group of TaN and WN. The first barrier layer 412n has a thickness $t_3$ ranging from 5 to 15 angstroms. The first barrier layer 412n may be formed by CVD, PVD or other suitable technique.

Still referring to FIGS. 3, 9A, 9B, and 9C, the method 300 continues with step 312 in which a signal metal layer 418 is deposited over the first work-function metal layer 414n in the first and second openings 420, 430. The signal metal layer 418 comprises a material selected from a group of Al, Cu and W. The signal metal layer 418 may be formed by CVD, PVD or other suitable technique.

In some embodiments, an optional second barrier layer 416n may be deposited before the signal metal layer 418 is deposited to reduce diffusion of the signal metal layer 418 into the gate dielectric 108. Thus the second barrier layer 416n is between the first work-function metal layer 414n and the signal metal layer 418. The second barrier layer 416n comprises a material selected from a group of TiN, TaN and WN. The second barrier layer 416n has a thickness $t_4$ ranging from 20 to 40 angstroms. The second barrier layer 416n may be formed by CVD, PVD or other suitable technique.

Still referring to FIGS. 3, 9A, 9B, and 9C, the method 300 continues with step 314 in which the signal metal layer 418 is planarized. A CMP is performed to remove the signal metal layer 418, second barrier layer 416n, first work-function metal layer 414n, and first barrier layer 412n outside of the first and second openings 420, 430. The signal metal layer 418 in the first openings 420 is referred to as a second portion 418p of the signal metal layer 418, and the signal metal layer 418 in the second openings 430 is referred to as a first portion 418n of the signal metal layer 418. Thus the second portion 418p of the signal metal layer 418 and the first portion 418n of the signal metal layer 418 are continuous and a single metal layer. In the present embodiment, a maximum thickness $t_5$ of the second portion 418p of the signal metal layer 418 is less than a maximum thickness $t_6$ of the first portion 418n of the signal metal layer 418. For example, the second portion 418p of the signal metal layer 418 has a maximum thickness $t_5$ ranging from 100 to 200 angstroms, and the first portion 418n of the signal metal layer 418 has a maximum thickness $t_6$ ranging from 350 to 450 angstroms.

The first portion 414a of the first work-function metal layer 414n and the first portion 418n of the signal metal layer 418 are collectively referred to as a first gate electrode 410n of nMOSFET 400n. In the present embodiment, the first portion 414a of the first work-function metal layer 414n is under the first portion 418n of the signal metal layer 418. Further, the second portion 414b of the first work-function metal layer 414n, the second work-function metal layer 414p and the second portion 418p of the signal metal layer 418 are collectively referred to as a second gate electrode 410p of pMOSFET 400p. In the present embodiment, the second portion 414b of the first work-function metal layer 414n is interposed between the second work-function metal layer 414p and the second portion 418p of the signal metal layer 418. Further, the second portion 418p of the signal metal layer 418 is over the second portion 414b of the first work-function metal layer 414n.

In the present embodiment, the interconnect structure 410 comprises the first gate electrode 410n and second gate electrode 410p. It should be noted as in FIG. 4 that both the first portion 418n and the second portion 418p of the signal metal layer 418 comprise same low-resistance conductive material. Therefore, a shift in the position of the contact 430 to the signal metal layer 418 does not change the contact resistance to either MOSFETs 400p/400n since both MOSFETs contact the same signal metal layer 418. Applicant's method of fabricating a semiconductor device 400 may fabricate a fixed-contact-resistance interconnection structure 410 to provide a stable voltage supply to the interconnection structure 410, thereby enhancing the device performance.

It is understood that the semiconductor device 400 may undergo further CMOS processes to form various features such as contacts/vias, interconnect metal layers, dielectric layers, passivation layers, etc. It has been observed that the modified interconnection structure 410 used as the gate contact material provides a contact resistance to the semiconductor device 400 that is less sensitive to process variations.

While the invention has been described by way of example and in terms of the exemplary embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate an interconnection structure for semiconductor devices. In this way, an interconnection structure has a fixed-contact-resistance.

What is claimed is:

1. An interconnection structure comprising:
   a first gate electrode having a first portion of a first work-function metal layer under a first portion of a signal metal layer;
   a second gate electrode having a second portion of the first work-function metal layer interposed between a second work-function metal layer and a second portion of the signal metal layer, wherein the second portion of the signal metal layer is over the second portion of the first work-function metal layer, wherein the second portion of the signal metal layer and the first portion of the signal metal layer are continuous, wherein a maximum thickness of the second portion of the signal metal layer is less than a maximum thickness of the first portion of the signal metal layer;
   a first barrier layer between the first work-function metal layer and the second work-function metal layer and extending along a sidewall of the first work-function metal layer; and
   a second barrier layer between the signal metal layer and the first work-function metal layer.

2. The interconnection structure of claim 1, wherein the second portion of the signal metal layer and the first portion of the signal metal layer are a single metal layer.

3. The interconnection structure of claim 1, wherein the first portion of the signal metal layer has a maximum thickness ranging from 350 to 450 angstroms.

4. The interconnection structure of claim 1, wherein the second portion of the signal metal layer has a maximum thickness ranging from 100 to 200 angstroms.

5. The interconnection structure of claim 1, wherein the signal metal layer comprises a material selected from a group of Al, Cu and W.

6. The interconnection structure of claim 1, wherein the second portion of the first work-function metal layer and the first portion of the first work-function metal layer are continuous.

7. The interconnection structure of claim 1, wherein the first work-function metal layer has a maximum thickness ranging from 30 to 80 angstroms.

8. The interconnection structure of claim 1, wherein the second work-function metal layer has a maximum thickness ranging from 150 to 350 angstroms.

9. The interconnection structure of claim 1, wherein the first work-function metal layer comprises a material selected from a group of Ti, Ag, Al, TiAl, TiAlN, TaC, TaCN, TaSiN, Mn, and Zr.

10. The interconnection structure of claim 1, wherein the second work-function metal layer comprises a material selected from a group of TiN, WN, TaN, and Ru.

11. The interconnection structure of claim 1, wherein the first barrier layer has a thickness ranging from 5 to 15 angstroms.

12. The interconnection structure of claim 1, wherein the second barrier layer has a thickness ranging from 20 to 40 angstroms.

13. The interconnection structure of claim 1, further comprising a contact configured to connect the first portion of the signal metal layer and the second portion of the signal metal layer to an external voltage.

14. The interconnection structure of claim 1, wherein the first work-function metal layer comprises a different material than the second work-function metal layer.

15. The interconnection structure of claim 1, further comprising a plurality of gate spacers along sidewalls of the first work-function metal layer.

16. An interconnection structure comprising:
a first gate electrode having a first portion of a first work-function metal layer under a first portion of a signal metal layer;
a second gate electrode having a second portion of the first work-function metal layer interposed between a second work-function metal layer and a second portion of the signal metal layer, wherein the second portion of the signal metal layer is over the second portion of the first work-function metal layer, wherein the second portion of the signal metal layer and the first portion of the signal metal layer are continuous, wherein a maximum thickness of the second portion of the signal metal layer is less than a maximum thickness of the first portion of the signal metal layer;
a plurality of gate spacers along sidewalls of the first work-function metal layer;
a first barrier layer between the first work-function metal layer and the plurality of gate spacers; and
a second barrier layer, wherein the first work-function metal layer is between the second barrier layer and the plurality of gate spacers.

17. The interconnection structure of claim 16, wherein the second portion of the signal metal layer and the first portion of the signal metal layer are a single metal layer.

18. The interconnection structure of claim 16, wherein the second portion of the first work-function metal layer and the first portion of the first work-function metal layer are continuous.

19. The interconnection structure of claim 16, further comprising a contact configured to connect the first portion of the signal metal layer and the second portion of the signal metal layer to an external voltage.

20. The interconnection structure of claim 16, wherein the first work-function metal layer comprises a different material than the second work-function metal layer.

* * * * *